SEMICONDUCTOR DEVICES

Filed May 6, 1957 3 Sheets-Sheet 1

INVENTOR.
SCHUYLER M. CHRISTIAN
BY
ATTORNEY

INVENTOR.
SCHUYLER M. CHRISTIAN
BY J. C. Whittaker
ATTORNEY

Oct. 12, 1965 S. M. CHRISTIAN 3,211,970

SEMICONDUCTOR DEVICES

Filed May 6, 1957 3 Sheets-Sheet 3

INVENTOR.
SCHUYLER M. CHRISTIAN
BY J. L. Whittaker
ATTORNEY

United States Patent Office 3,211,970
Patented Oct. 12, 1965

3,211,970
SEMICONDUCTOR DEVICES

Schuyler M. Christian, Princeton, N.J., assignor to Radio Corporation of America, a corporation of Delaware Filed May 6, 1957, Ser. No. 657,114
13 Claims. (Cl. 317—235)

Figure 1:
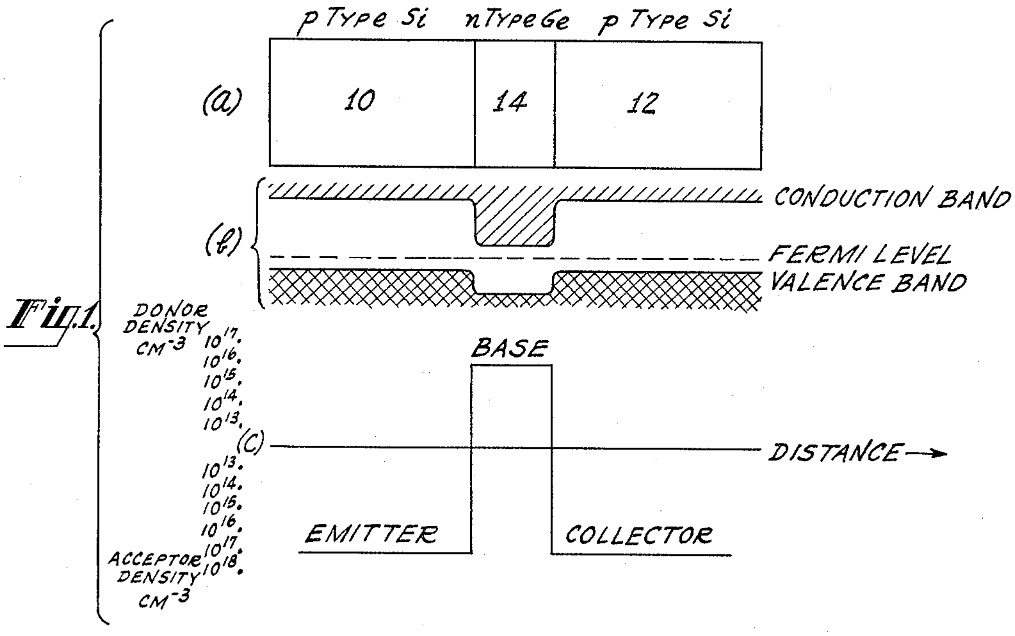

This invention relates to improved semiconductor devices and methods of making them. More particularly, it relates to improved semiconductor devices utilizing at least two different semiconductive materials having different characteristic energy gaps.

It is known that semiconductor devices of the junction transistor type are improved if the emitter semiconductive material has a higher energy gap than the base semiconductive material. A unit formed in this manner has an emitter efficiency which is greater than that available when the emitter-base rectifying barrier is formed in homogeneous energy gap materials. See for example article by H. Kroemer, "Zur Theorie des Diffusions und des Drift-Transistors III," A. E. U. 8 (1964), pp. 499–504. The energy gap, also known as the bandgap, is the forbidden energy region between the valence band and the conduction band of the semiconductor. It is also interpreted as the ionization potential or the additional energy which must be given to an electron in the valence band to elevate that electron to the conduction band. Different semiconductive materials have different energy gaps which are characteristic of the material. However, it has been found difficult to fabricate semiconductor devices from more than one material so as to have differing energy gaps in different regions.

It is therefore an object of this invention to provide improved semiconductor devices utilizing materials having different energy gaps.

Another object of this invention is to provide improved semiconductor devices made of two or more different semiconductive materials.

Still another object of this invention is to provide an improved type of transistor having an emitter with a higher energy gap than the base region.

Yet another object of this invention is to provide improved semiconductor devices having a region in which the energy gap is graded.

But another object of this invention is to provide improved semiconductor devices having a region in which the energy gap and the conductivity both increase in the same direction.

These and other objects and advantages of the invention are accomplished by heating a thin layer or film of one suitably doped semiconductive material having a first characteristic energy gap between two suitably doped identically oriented monocrystalline wafers of another semiconductive material having a second characteristic energy gap. The materials selected preferably have similar crystal structures and lattice constants. After the thin layer or film melts and dissolves some of the wafer material, the assembly is cooled under pressure, or in a jig which retains the wafers firmly in position, thereby bonding a low energy gap base between two wafers of high energy gap. If desired, the assembly is cooled in a steep temperature gradient so that the central molten layer freezes and recrystallizes asymmetrically. Since the recrystallized layer consists of a mixture of continuously varying composition of materials having different characteristic energy gaps, the resulting structure has a central region which is graded as to energy gap.

The invention and its advantages will be described in greater detail with reference to the accompanying drawing, in which FIGURE 1 is a schematic cross-sectional view of a first embodiment of the invention, together with a diagram of energy levels and a graph of acceptor-donor concentrations in the different regions.

FIGURES 2–5 are schematic cross-sectional views of other embodiments of the invention together with diagrams of energy levels and graphs of acceptor-donor concentrations useful in explaining their operations.

Similar reference numerals have been applied to similar elements throughout the drawing.

Referring to FIGURE 1A of the drawing, two wafers 10 and 12 are prepared from an ingot of monocrystalline semiconductive material of one conductivity type and characteristic energy gap. If desired, the two wafers may be cut from two different ingots, so that one wafer has a higher concentration of impurity material and therefore a higher conductivity than the other wafer. The material selected is one with a relatively high melting point, for example silicon, and contains sufficient active ionizing impurity of either conductivity determining type to have a resistivity of about 0.1 to 100 ohm centimeters. For example, the impurity may be aluminum so that the silicon is of P-conductivity type. The size of the wafers is not critical. In this example, the wafers are about 250 mils square and 10 mils thick. The wafers are cut along the same crystalline plane, then etched and lapped to maintain their surfaces parallel to within one degree of arc.

A thin layer or a wafer 14 about 1 mil thick of a relatively low melting point semiconductive material, for example germanium, is placed between the wafers 10, 12, which are held closely parallel to within one degree of arc with respect to all crystal axes by means of a jig (not shown). For some applications, such as high frequency transistors, an extremely thin base region is required. This may be obtained by evaporating a film of the low melting point semiconductor material on a major surface of one wafer. The film may be made of the order of one micron thick. The conductivity type of the low melting point material selected is opposite to that of the wafers. In this example, the germanium is doped with antimony so as to be N-conductivity type. The low melting point material has a characteristic energy gap which is generally lower than that of the high melting point wafer material.

The assembly of jig, two wafers, and low melting central layer is next heated in an inert or reducing atmosphere to a temperature above the melting point of the central layer but below the melting point of the wafers. The thin central layer melts and dissolves some of the wafer material. The wafers are pressed against the central layer by any convenient method. Pressure is employed to overcome the surface tension of the molten central layer, which tends to ball the melt. In this example, the wafers are held in a horizontal position, and a weight of about 50 grams is placed on the uppermost wafter. The assembly is then cooled, so that the molten central layer freezes under pressure and firmly bonds the two wafers together. Since each wafer is about .25 inch square, the molten layer freezes under a pressure of about 800 grams per square inch. The resulting structure, composed of silicon-germanium-silicon in this example, is a sandwich consisting of a high melting point high energy gap wafer of one conductivity type, a low melting point low energy gap central layer of opposite conductivity type, and another high melting point high energy gap wafer of the same conductivity type as the first wafer.

A diagram (*b*) of the energy levels and a plot (*c*) of the impurity concentration in the different zones is also shown in the figure. This sandwich structure is readily made into devices such as transistors by conventional methods known to the art, such as dicing into units, mounting each unit, attaching electrodes to each layer and leads to each electrode, and encapsulating each unit.

For example, suitable ohmic electrodes to the P-type silicon may be made by surface alloying pellets of indium. An ohmic contact to the N-type germanium may be made by surface alloying a pellet consisting of 90 lead—10 antimony by weight. The thin central layer is made the base, while one wafer is the emitter and the other is the collector. As the emitter is of higher energy gap material than the base region, these transistors have improved emitter efficiency. P-N-P units have been described by way of example, and N-P-N units may be similarly fabricated by using appropriate type-determining impurities. For example, two silicon wafers may be prepared which have been doped with arsenic or phosphorus so as to be of N-conductivity type. They may then be bonded by a thin central layer of P-conductivity type germanium which has been doped with indium or gallium.

It will be understood that silicon and germanium have been mentioned by way of example, and not as a limitation. The invention is equally applicable to other pairs of semiconductive materials, the only restrictions being that the crystal form and the lattice constants of each pair of materials should be similar, that one member of the pair should have a higher melting point than the other, and that the two materials form a binary system in which the two components are mutually soluble in all proportions, or at least within the range which may be encountered. In general, the semiconductor with the higher melting point will also have the higher energy gap.

Examples of other such pairs of semiconductive materials which may be utilized for this purpose are semiconductive compounds such as indium phosphide and indium arsenide; also gallium phosphide and gallium arsenide. These materials are known as III–V compounds, because they are composed of one element from column III and one element from column V of the Periodic Table. They may be prepared with N-type conductivity by doping them with sulphur, selenium, or tellurium. Alternatively, they may be given P-type conductivity by doping them with zinc, cadmium, or mercury. Indium phosphide melts at 1070° C. and has an energy gap of 1.25 electron volts, while indium arsenide melts at 936° C. and has an energy gap of 0.33 electron volts. Both materials have the same crystal form namely the zincblende structure, and the lattice constants differ by only 3 percent. In utilizing this pair of materials, the two wafers are fabricated from indium phosphide of one conductivity type, while the opposite type central layer is the lower melting, lower energy gap indium arsenide. Gallium phosphide has an energy gap of 2.4 electron volts and melts at over 1300° C., while gallium arsenide has an energy gap of 1.35 electron volts and melts at 1240° C. In utilizing this pair of materials, the lower melting, lower energy gap gallium arsenide is made the central layer.

The uniting of different semiconductive materials in a single device has been very difficult. Although high pressures were used, the union of two different semiconductive materials generally has been fragile and unsatisfactory. It is believed that the present invention produces firm bonding between dissimilar semiconductive materials because the materials selected are monocrystalline, are oriented closely parallel with respect to all crystal axes, and have similar crystal structures and lattice constants.

An important feature of this invention is that it is not limited to devices made of two different semiconductive materials so as to have two different characteristic energy gaps. The invention may also be utilized to fabricate devices containing three different semiconductive materials and exhibiting three distinctive characteristic energy gaps. This may be accomplished by fabricating one wafer from one semiconductive material, preparing the other wafer from a second semiconductive material, and using a third semiconductive material for the thin central layer. The melting point of the two wafer materials selected should be higher than that of the third material forming the central layer. The wafers should be monocrystalline and of the same conductivity type. They should be selected from materials having the same crystal structure and similar lattice constants. The wafer are oriented so as to be closely parallel with respect to all crystal axes, and then bonded together under pressure by means of a thin opposite type central layer of the third semiconductive material, as described above.

Figure 2:
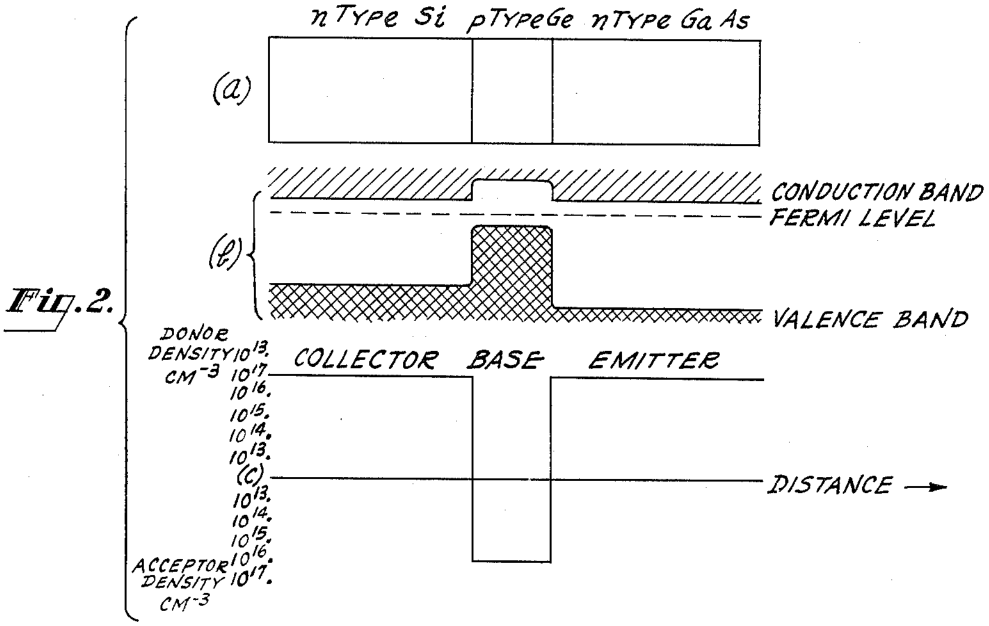

Referring to FIGURE 2 of the drawing, such a sandwich of three different semiconductive materials may be prepared, for example, by fabricating one wafer of silicon doped with antimony so as to be of N-conductivity type. The other wafer may be gallium arsenide doped with tellurium so as to also be of N-conductivity type. The central layer which serves as the base may be germanium doped with indium so as to be of P-conductivity type. The emitter should preferably be the gallium arsenide, because of its wide energy gap. The silicon is used as the collector. Ohmic contacts to the three different materials may be made by surface alloying an electrode pellet of indium to the P-type germanium base; soldering a contact to a nickel plating on the silicon; soldering a contact to a copper plating on the gallium arsenide.

Another important feature of this invention is the provision of a method for grading the energy gap of the refrozen central layer. When the energy gap of a semiconductive region varies regularly from high at one end of the region to low at the other end, the region is said to have a graded energy gap. Such a region may be made by the method of this invention by cooling asymmetrically the assembly of jig, two silicon wafers, and low melting central germanium layer described above with reference to FIGURE 1. Asymmetrical cooling may be accomplished by any convenient method, for example by blowing a cold inert gas against the wafer which is to be cooled first. An alternative method of maintaining a temperature gradient is to utilize a jig having a hollow retaining member adjacent to each wafer. A cooling fluid is pumped into a hollow retaining member of the jig after the heating step. In this method the temperature gradient may be controlled by varying the temperature of the cooling fluid and the rate at which it is pumped. The molten central layer freezes transversely, beginning at the surface in contact with the cooled wafer and extending through its thickness to the surface in contact with the other wafer. The sandwich structure thus prepared is readily fabricated into devices such as the transistor shown in FIGURE 3 by conventional methods, including dicing into units, mounting each unit, and connecting electrodes to each unit as described above.

Figures 3, 4:
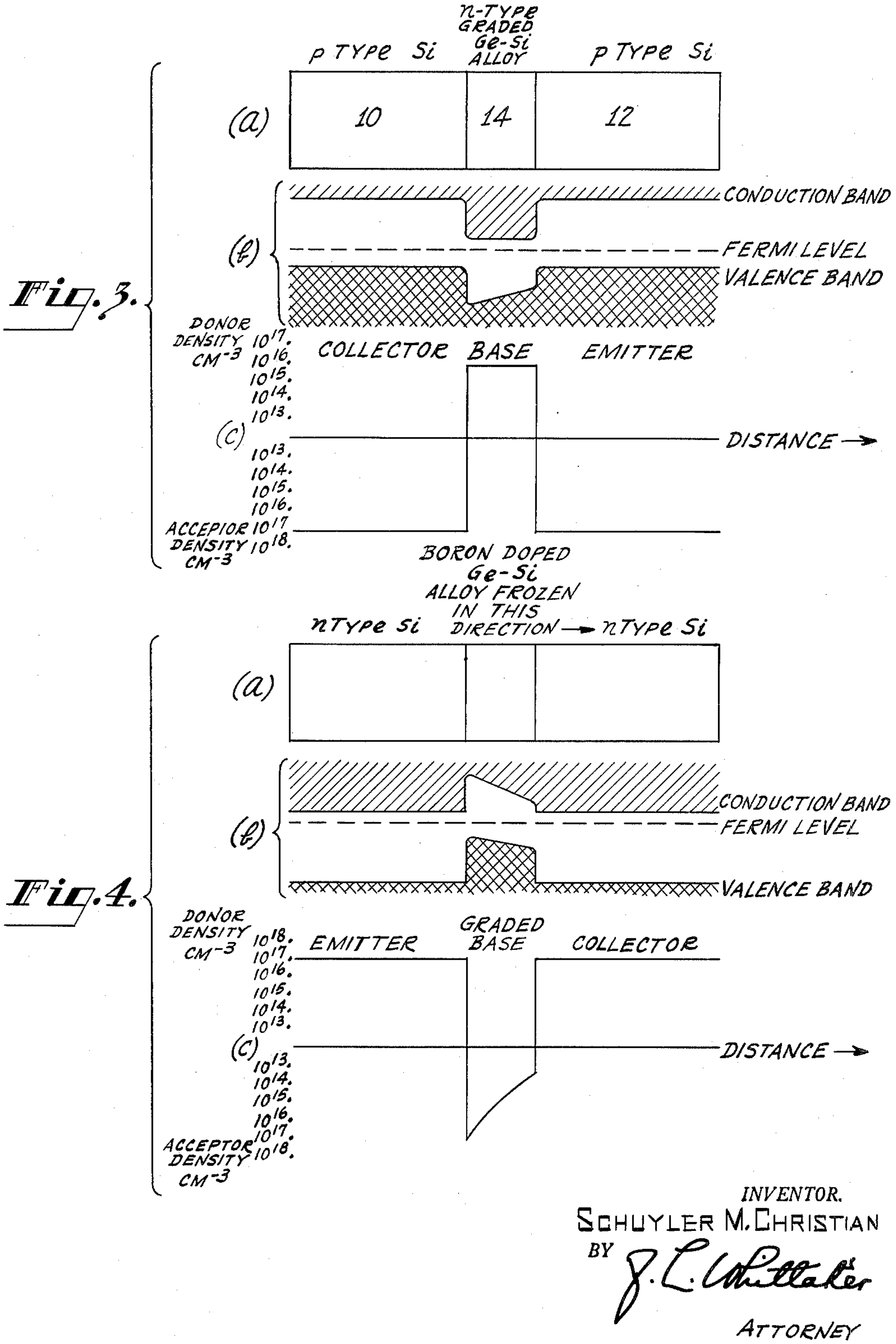

Since the central germanium layer when molten dissolves some material from the surface of each silicon wafer, and the distribution coefficient of silicon in germanium is greater than one, the portion of the central layer which freezes first contains more silicon than the portion which freezes last. Thus the central layer becomes a germanium-silicon alloy of continuously graded composition. It has been shown that the energy gap of such a continuously varying mixture of high-gap and low-gap materials is a monotonic function of the ratio of the two components. See E. R. Johnson and S. M. Christian, "Some Properties of Germanium-Silicon Alloys," Physical Review 95, 560 (1954). Accordingly, the energy gap of the refrozen central base layer of the transistor shown in FIGURE 3 is graded from high at the portion first to freeze to low at the portion last to freeze. A graded energy gap in the base region is desirable because it accelerates the passage of minority charge carriers in one direction and the transit of majority charge carriers in the opposite direction.

Another feature of this invention is the provision of a method for grading the conductivity of the central refrozen layer, in addition to grading the energy gap of that layer. The concentration of the conductivity type-determining impurity in the central layer may be uniformly varied transversely through the layer from high adjacent to one wafer surface to low adjacent to the other wafer surface by the method of this invention. When the impurity concentration in a region of a semiconductor device varies regularly from high at one end of the region to low at the other end, the conductivity of the region varies similarly, and the region is said to be graded as to conductivity. It has been shown that a region of graded conductivity adjacent to a broad-area P-N junction establishes a potential field, known as a drift field. A drift field improves certain operational characteristics of a P-N junction device by accelerating the drift of minority charge carriers in transit across the potential field. A potential field can be established by other means, but devices with a region of graded conductivity have the advantage of a built-in drift field established and maintained without any external power supply. A junction transistor in which the concentration of impurity in the base region is graded from high values at the emitter to low values at the collector has improved alpha cut-off frequency, low base lead resistance, and low collector capacitance. Such a device is known as a drift transistor. The practical advantages and theoretical basis of the drift field, with particular reference to semiconductor devices of the transistor type, are described by H. Kroemer in "Transistors I," page 202 et seq., RCA Laboratories, 1956, Princeton, New Jersey.

The method of this invention may be employed to fabricate semiconductor devices, such as drift transistors, having graded conductivity in the base region. For this purpose, the invention utilizes the differential solubility of an impurity in the liquid and solid phases of an equilibrium system. The distribution coefficient of the type-determining impurity in the refrozen central layer is defined as the ratio of the concentration of the impurity in the solid to that in the liquid in equilibrium with the solid. The distribution coefficient is also known as the segregation coefficient, and is symbolized as $k$. If the distribution coefficient of the conducivity type-determining impurity is greater than unity, then the concentration of the impurity in the solid is greater than the impurity concentration in the melt which is in equilibrium with the solid. The portion of the molten central layer which freezes first will therefore contain more impurity than the portion which freezes last. Hence the portion of the central layer which is first to freeze will have a higher conductivity than the remainder, and the conductivity of the central layer will be graded transversely from high at one wafer surface to low at the other wafer surface. An example of such a type-determining impurity with a distribution coefficient greater than unity is boron, which has a distribution coefficient equal to about 10 in germanium.

Conversely, if the distribution coefficient $k$ is less than unity, then the portion of the molten central layer which freezes first has a lower concentration of impurity than the portion which freezes last. Accordingly, the conductivity of the central layer in this case is also graded, but in the opposite direction, being low at the side first to freeze, and high at the side last to freeze. An example of such an impurity is bismuth, which has a distribution coefficient equal to about .00005 in germanium.

The method of this invention can thus be used to fabricate a semiconductor device which combines three advantages; first, high emitter efficiency, since the energy gap of the emitter is higher than that of the base region; second, low collector capacitance, low base lead resistance, and improved high frequency operation, since the graded base conductivity produces a drift field which accelerates the transit of minority charge carriers; third, improved performance due to an enhanced drift field in the base region, as the graded energy gap in that region creates a field that favors the passage of the majority charge carriers. To obtain the advantages of a drift transistor, the wafer adjacent to the high conductivity portion of the central layer is made the emitter, and the other wafer is made the collector.

Such a device a may be prepared, for example, by fabricating a silicon-germanium-silicon sandwich from phosphorus doped N-conductivity type silicon wafers bonded by a thin central layer of boron doped P-conductivity type germanium. The assembly is first heated so that the germanium layer melts and dissolves some of the silicon, then cooled in a temperature gradient so that the central germanium layer freezes transversely, beginning at one wafer face. The portion of the central layer first to freeze is rich in dissolved silicon, while the portion last to freeze has very little silicon. Hence the energy gap of the central layer varies continuously from high at the side freezing first to low at the side freezing last. The concentration of boron in the portion first to freeze is high, while the concentration of boron in the portion last to freeze is low, since boron is less soluble in the melt than in the solid. Hence the resistivity of the central layer also varies continuously from low at the side freezing first to high at the side freezing last. The sandwich is then diced and used to make transistors by conventional methods of dicing into units, mounting each unit, and attaching electrical connections to each unit, taking care to use the wafer adjacent to the side freezing first as the emitter.

FIGURE 4 includes a graph of the conductivity type-determining impurity distribution in the different regions of such a device, and a representation of the energy levels associated with each region. In this device, the conductivity of the base region is graded from high at the emitter side to low at the collector side. The energy gap of the base region is graded in the same direction, being high at the emitter side and low at the collector side. The advantages of a graded energy gap in the base region are two-fold: first, it creates an electric field for the minority charge carriers, and thus reinforces the drift field produced by graded conductivity, when both fields are in the same direction; second, it also creates a field that accelerates the majority charge carriers as well. The normal graded conductivity drift transistor does not affect the motion of majority charge carriers.

An important feature of this invention is the provision of a measure of independent control of the different parameters involved. The central layer may be given a steep conductivity gradient by selecting as the conductivity type-determining impurity in the layer a material which has a value of $k$, that is, a segregation coefficient, which is considerably removed from unity. Conversely, a shallow conductivity gradient may be obtained by selecting a doping agent with a segregation coefficient close to unit. The direction of the conductivity gradient may be controlled independently of the gradient steepness by selecting doping agents in which $k$ is either more or less than unity. If high conductivity is desired in the portion first to freeze, an impurity is selected for which $k$ is greater than unity. Conversely, if high conductivity is desired in the portion which freezes last, a doping agent is selected for which $k$ is less than unity. The central layer may be given a steep energy gap gradient by freezing it slowly and asymmetrically. Conversely, if a shallow energy gap gradient is desired, the central layer may be frozen asymmetrically and rapidly. To illustrate the flexibility of the method, the central layer can be frozen very rapidly and symmetrically by cooling both wafers, in which case the energy gap of the central layer will in effect not be graded. If the central layer doping agent selected has a value of $k$ close to unity, the energy gap of the central layer will be graded, while the grading of the conductivity of the central layer will be slight.

Since the aforementioned characteristics of the refrozen central layer may be controlled independently, this invention makes it possible to prepare devices in which the central, or base layer, has the following characteristics: conductivity not graded, energy gap graded; conductivity graded, energy gap graded in the same direction; conductivity graded, energy gap graded in opposite direction. It will be understood that in each case where there is grading, the gradient may be controlled as desired to be steep or shallow, by the methods explained above.

Figure 5:
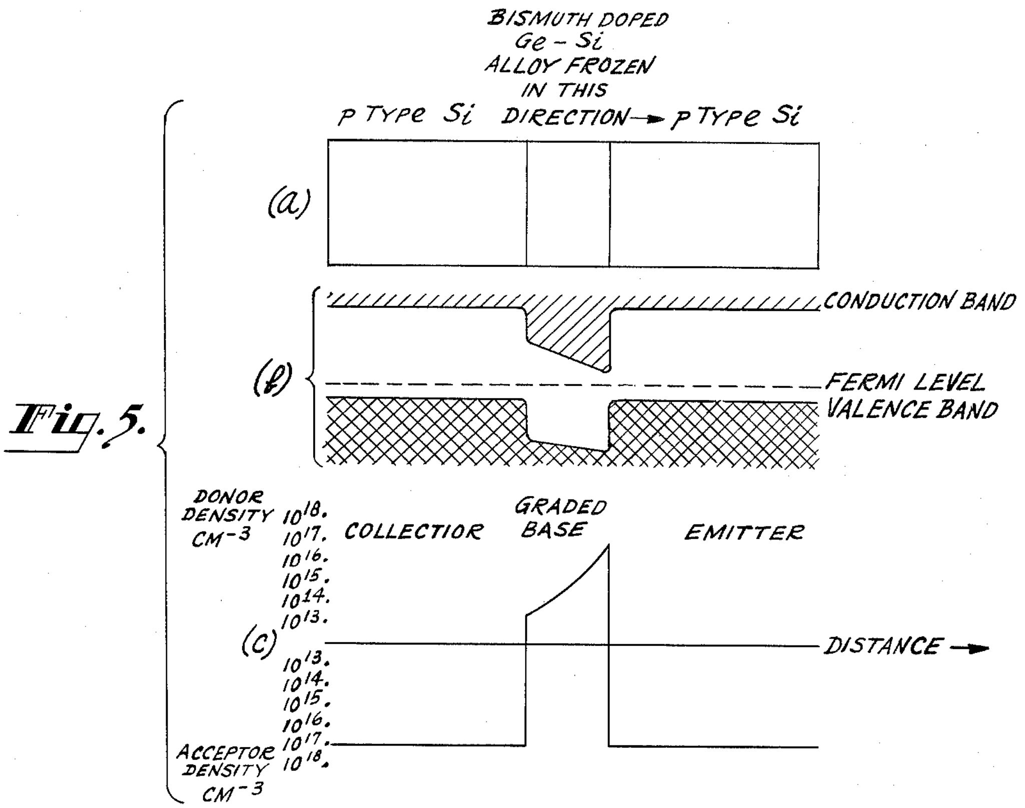

A structure in which the conductivity and energy gap are graded in the same direction has already been shown in FIGURE 4. Referring to FIGURE 5 of the drawing, another type of structure may be realized by utilizing a central layer doping agent in which $k$ is considerably less than unity. For example, bismuth has a value of $k$ equal to $5\times10^{-5}$ in germanium. P-type silicon wafers doped with aluminum are bonded by a layer of N-type germanium doped with bismuth. The cooling step is again performed slowly and asymmetrically. The resulting sandwich is diced into units which are mounted and provided with ohmic electrical connections as described above. Thus both the conductivity and the energy gap of the central N-type germanium layer are graded, but in contrast to the structure shown in FIGURE 4, they are graded in opposite directions. In transistors having this structure the conductivity decreases from high at the emitter side to low at the collector side of the central base region, while the energy gap decreases from high at the collector side to low at the emitter side.

The invention may be modified by cutting the two wafers at small predetermined angles with respect to their lattice planes. The resulting welded junction then forms a single artificial grain boundary between two lattices rotated with respect to each other at any predetermined angle.

It will be understood that the method of this invention may also be used to fabricate single junction devices such as diodes. For example, a wafer of P-conductivity type silicon may be bonded to a wafer of N-conductivity type germanium, or a wafer of N-conductivity type gallium arsendie may be bonded to a wafer of P-conductivity type germanium. Alternatively, a three-layer sandwich structure may be prepared, and one of the outer layers subsequently removed by lapping or etching. Junctions may also be formed between zones of different semiconductive materials having the same conductivity type but differing in conductivity.

There have thus been described improved semiconductor devices utilizing more than one semiconductive material to produce zones of different energy gap in each unit.

What is claimed is:

1. A semiconductor device comprising a first layer of semiconductive material of given conductivity type and energy gap, an adjacent second layer of another semiconductive material of opposite conductivity type and different energy gap in rectifying contact with said first layer, a third layer of semiconductive material of said given conductivity type and energy gap in rectifying contact with said second layer, the energy gap of said second layer being graded from high adjacent said first layer to low adjacent said third layer, and electrodes connected to each of said layers.

2. A semiconductor device comprising a first layer of semiconductive material of given conductivity type and energy gap, an adjacent second layer of another semiconductive material of opposite conductivity type and different energy gap in rectifying contact with said first layer, a third layer of semiconductive material of said given conductivity type and energy gap in rectifying contact with said second layer, the energy gap and conductivity of said second layer being graded in the same direction, and electrodes connected to each of said layers.

3. A semiconductor device comprising a first layer of semiconductive material of given conductivity type and energy gap, an adjacent second layer of another semiconductive material of opposite conductivity type and different energy gap in rectifying contact with said first layer, a third layer of semiconductive material of said given conductivity type and energy gap in rectifying contact with said second layer, the energy gap and conductivity of said second layer being graded in opposite directions, and electrodes connected to each of said layers.

4. A semiconductor device comprising a first layer of semiconductive material of given conductivity type and first energy gap, a second layer of semiconductive material of opposite conductivity type and second energy gap in rectifying contact with said first layer, a third layer of semiconductive material of said given conductivity type and third energy gap in rectifying contact with said second layer, the conductivity of said second layer being graded from high adjacent said first layer to low adjacent said third layer, and electrodes connected to each of said layers.

5. A semiconductor device comprisng a first layer of semiconductive material of given conductivity type and first energy gap, a second layer of semiconductive material of opposite conductivity type and second energy gap in rectifying contact with said first layer, a third layer of semiconductive material of said given conductivity type and third energy gap in rectifying contact with said second layer, the energy gap of said second layer being graded from high adjacent said first layer to low adjacent said third layer, and electrodes connected to each of said layers.

6. A semiconductor circuit element comprising a first region of semiconductive material having a first characteristic energy gap, a second region of semiconductive material having a second characteristic energy gap in rectifying contact with said first region, a third region of semiconductive material having a third characteristic energy gap in rectifying contact with said second region, and ohmic contacts to each said region.

7. A circuit element comprising a first region of semiconductive material of given conductivity type, a second region of semiconductive material of opposite conductivity type in rectifying contact with said first region, a third region of semiconductive material of the said given conductivity type in rectifying contact with said second region, each said region having a different characteristic energy gap, and ohmic contacts to each said region.

8. A circuit element comprising a first region of given conductivity type, a second region of opposite conductivity type in rectifying contact with said first region, a third region of the said given conductivity type in rectifying contact with said second region, each said region being made of a different semiconductive material, and ohmic contacts to each said region.

9. An heterojunction semi-conductor device comprising at least one semi-conductive crystalline region constituted by a binary semi-conductor material having substantially the same crystal lattice and interatomic distance as crystalline germanium and a melting point higher than that of germanium, said material being selected from the group consisting of gallium arsenide and indium phosphide and at least another semi-conductive region constituted by a epitaxially deposited resolidified germanium crystal which is grown parallel onto said crystalline region from a molten body.

10. A semiconductor device comprising:

a first layer of a givien conductivity type first semiconductive material having a first energy gap;

a second layer of an opposite conductivity type second semiconductive material different from said first material and having a second energy gap, said second layer being in rectifying contact with said first layer;

a third layer of a said given conductivity type third semiconductive material different from said first two materials and having a third energy gap, said third layer being in rectifying contact with said second layer; and, three electrodes connected respectively to said three layers.

11. A semiconductor device comprising:

a first layer of a given conductivity type first semiconductive material having a first energy gap;

a second layer of an opposite conductivity type second semiconductive material different from said first material and having a second energy gap, said second layer being in rectifying contact with said first layer;

a third layer of a said given conductivity type third semiconductive material different from said first two materials and having a third energy gap, said third layer being in rectifying contact with said second layer, the conductivity of said second layer being graded from high to low in one direction between said first and third layers, the energy gap of said second layer being graded from high to low between said first and said third layers in the same one direction; and, three electrodes connected respectively to said three layers.

12. A semiconductor device comprising:

a first layer of a given conductivity type first semiconductive material having a first energy gap;

a second layer of an opposite conductivity type second semiconductive material different from said first material and having a second energy gap, said second layer being in rectifying contact with said first layer;

a third layer of a said given conductivity type third semiconductive material different from said first two materials and having a third energy gap, said third layer being in rectifying contact with said second layer, the conductivity of said second layer being graded from high to low in a first direction between said first and third layers, the energy gap of said second layer being graded from high to low between said first and said third layers in a second direction opposite said first direction; and, three electrodes connected respectively to said three layers.

13. A transistor comprising:

an emitter region of a given conductivity type first semiconductive material having a first energy gap;

a base region of an opposite conductivity type second semiconductive material different from said first material and having a second energy gap and in rectifying contact with said emitter region;

a collector region of a said given conductivity type third semiconductive material having a third energy gap and in rectifying contact with said base region, the conductivity of said base region being graded from high at said emitter to low at said collector; and, three electrodes ohmically connected to said emitter region, said graded base region, and said collector region respectively.

References Cited by the Examiner

UNITED STATES PATENTS

| | | | |
|---|---|---|---|
| 2,569,347 | 9/51 | Shockley | 148—1.5 |
| 2,623,102 | 12/51 | Shockley | 148—1.5 |
| 2,708,646 | 5/55 | North | 148—1.5 |
| 2,743,201 | 4/56 | Johnson et al. | 148—1.5 |
| 2,831,787 | 4/58 | Emeis | 148—1.5 |
| 2,843,516 | 7/58 | Herlet | 148—33 |
| 2,846,340 | 8/58 | Jenny | 148—1.5 |
| 2,854,365 | 9/58 | Matare | 148—33 |
| 2,855,334 | 10/58 | Lemovec | 148—33 X |
| 2,878,152 | 3/59 | Runyan et al. | 148—33 |

FOREIGN PATENTS

| | | |
|---|---|---|
| 742,237 | 12/55 | Great Britain. |

HYLAND BIZOT, *Primary Examiner.*

CLYDE A. LEROY, ROGER L. CAMPBELL, RAY K. WINDHAM, MARCUS U. LYONS, DAVID L. RECK, *Examiners.*